(12) United States Patent
Cunanan et al.

(10) Patent No.: US 9,209,642 B2
(45) Date of Patent: Dec. 8, 2015

(54) BATTERY PACK IDENTIFICATION SCHEME FOR POWER TOOL SYSTEMS

(71) Applicant: Black & Decker Inc., Newark, DE (US)

(72) Inventors: Regina G. C. Cunanan, Parkville, MD (US); Frank J. Delose, Baltimore, MD (US); Bhanuprasad V. Gorti, Perry Hall, MD (US); Geoffrey S. Howard, Columbia, MD (US); Aziz Iqbal, New Haven, CT (US); Matt J. Velderman, Baltimore, MD (US); Daniel J. White, Baltimore, MD (US)

(73) Assignee: Black & Decker Inc., Newark, DE (US)

( * ) Notice: Subject to any disclaimer, the term of this patent is extended or adjusted under 35 U.S.C. 154(b) by 0 days.

(21) Appl. No.: 14/181,831

(22) Filed: Feb. 17, 2014

(65) Prior Publication Data

US 2014/0159642 A1 Jun. 12, 2014

Related U.S. Application Data

(63) Continuation of application No. 13/080,787, filed on Apr. 6, 2011, now Pat. No. 8,653,787.

(60) Provisional application No. 61/321,699, filed on Apr. 7, 2010.

(51) Int. Cl.

| H02J 7/00 | (2006.01) |
|---|---|
| B25F 5/02 | (2006.01) |
| H01M 10/44 | (2006.01) |
| H02J 7/04 | (2006.01) |
| H02P 7/29 | (2006.01) |
| H01M 10/48 | (2006.01) |
| H05B 33/08 | (2006.01) |
| H02P 3/08 | (2006.01) |
| H02P 7/285 | (2006.01) |
| H01H 9/06 | (2006.01) |
| H01M 10/42 | (2006.01) |
| G01R 31/36 | (2006.01) |

(Continued)

(52) U.S. Cl.
CPC ............... *H02J 7/007* (2013.01); *B25F 5/021* (2013.01); *G01R 31/3627* (2013.01); *H01M 10/441* (2013.01); *H01M 10/482* (2013.01); *H02J 7/0003* (2013.01); *H02J 7/0008* (2013.01); *H02J 7/0019* (2013.01); *H02J 7/0021* (2013.01); *H02J 7/0031* (2013.01); *H02J 7/0047* (2013.01); *H02J 7/0063* (2013.01); *H02J 7/045* (2013.01); *H02P 3/08* (2013.01); *H02P 7/285* (2013.01); *H02P 7/29* (2013.01); *H05B 33/0806* (2013.01); *G01R 31/362* (2013.01); *G01R 31/3682* (2013.01); *H01H 9/061* (2013.01); *H01M 2010/4271* (2013.01); *H01M 2010/4278* (2013.01); *H01M 2220/30* (2013.01); *H02J 2007/004* (2013.01);

(Continued)

(58) Field of Classification Search
CPC ......... B25F 5/021; H02J 7/007; H02J 7/0008; H02J 7/0019; H02J 7/045; H02J 7/0047; H02J 7/0031; H02J 7/0003; H02J 7/0063; H02J 7/0021; H01M 10/441; H01M 10/482; H02P 7/29; H05B 33/0806; G01R 31/3627
USPC ........................................................ 320/106
See application file for complete search history.

(56) References Cited

U.S. PATENT DOCUMENTS 5,218,284 A * 6/1993 Burns et al. .................... 320/112
5,684,387 A * 11/1997 Patino .......................... 320/106

(Continued)

*Primary Examiner* — M'Baye Diao
(74) *Attorney, Agent, or Firm* — Michael Aronoff

(57) ABSTRACT

A method is provided for identifying a battery pack that is operably coupled to a battery charger. The method comprises: measuring voltage at a plurality of designated terminals of a first battery pack while the battery pack is coupled to the battery charger; determining how many of the designated terminals are connected to a reference voltage, such as battery positive; and identifying an attribute of the battery pack based on how many of the designated terminals are connected to the reference voltage.

10 Claims, 14 Drawing Sheets

(51) Int. Cl.
*H02P 7/00* (2006.01)
*H02P 31/00* (2006.01)

(52) U.S. Cl.
CPC ......... *H02J 2007/0067* (2013.01); *H02P 31/00* (2013.01); *H02P 2007/0088* (2013.01)

(56) References Cited

U.S. PATENT DOCUMENTS

| | | | |
|---|---|---|---|
| 5,831,350 A * | 11/1998 | McConkey et al. | 307/150 |
| 5,850,136 A * | 12/1998 | Kaneko | 320/119 |
| 5,854,549 A * | 12/1998 | Paulick | 320/110 |
| 5,945,803 A * | 8/1999 | Brotto et al. | 320/106 |
| 6,154,004 A * | 11/2000 | Higuchi | 320/106 |
| 6,329,788 B1 * | 12/2001 | Bailey et al. | 320/114 |
| 6,586,909 B1 * | 7/2003 | Trepka | 320/108 |
| 7,221,124 B2 * | 5/2007 | Howard et al. | 320/106 |
| 7,423,407 B2 * | 9/2008 | Watson et al. | 320/114 |
| 7,598,705 B2 * | 10/2009 | Watson et al. | 320/114 |
| 7,834,594 B2 * | 11/2010 | Wang et al. | 320/162 |
| 7,990,276 B2 * | 8/2011 | Cruise | 340/636.2 |
| 8,653,787 B2 * | 2/2014 | Cunanan et al. | 320/106 |
| 2007/0285055 A1 * | 12/2007 | Meyer et al. | 320/116 |
| 2008/0241675 A1 * | 10/2008 | Enari et al. | 429/179 |
| 2008/0309286 A1 * | 12/2008 | Hoff | 320/107 |
| 2009/0174563 A1 * | 7/2009 | Cruise | 340/636.2 |

* cited by examiner

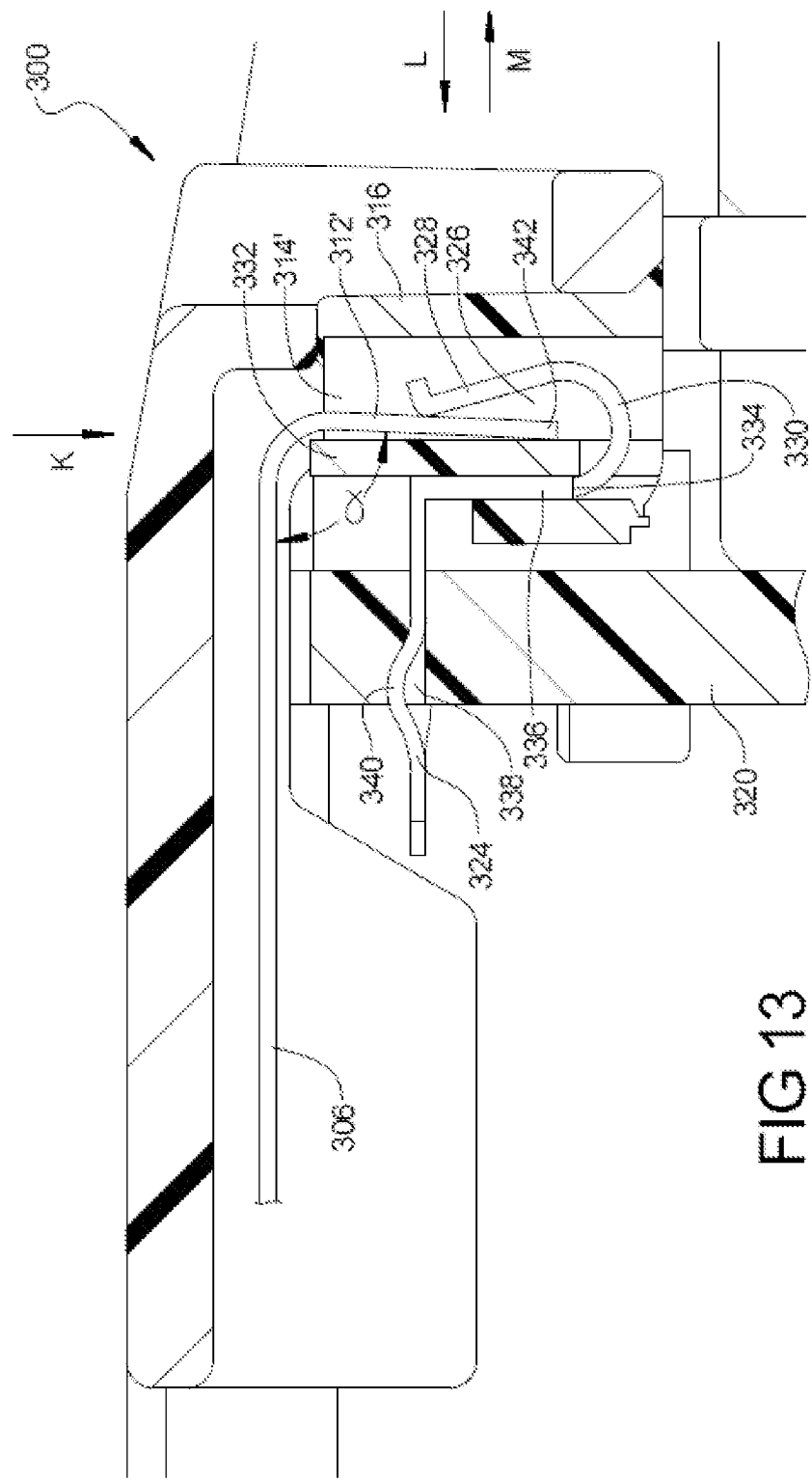

_US 9,209,642 B2_

BATTERY PACK IDENTIFICATION SCHEME FOR POWER TOOL SYSTEMS

CROSS-REFERENCE TO RELATED APPLICATIONS

This continuation application claims the benefit of U.S. Non-Provisional application Ser. No. 13/080,787 filed on Apr. 6, 2011 now U.S. Pat. No. 8,653,787 and U.S. Provisional Application No. 61/321,699 filed on Apr. 7, 2010. The disclosure of the above applications is incorporated herein by reference.

FIELD

The present disclosure relates to an improved identification scheme for battery packs in a power tool system.

BACKGROUND

Cordless products or devices which use rechargeable batteries are prevalent in the marketplace. Rechargeable batteries may be used in numerous devices ranging from computers to power tools. Since the devices use a plurality of battery cells, the battery cells are commonly packaged in a battery pack. The battery pack may in turn be used to power the devices when coupled thereto. Once depleted, the battery pack may be recharged by a battery charger.

Typically, a battery charger can only charge a specific type of battery pack as the terminal arrangement amongst different types of battery packs vary. For example, a 20 volt battery pack may have a different terminal arrangement than a 14 volt battery pack. It is appreciated that these two different battery packs may require two different battery chargers. One way to avoid the need for multiple battery chargers is to create a standard interface between different types of battery packs. In this way, it may be feasible to charge each of the different types of battery packs using the same battery charger. To ensure a proper charging algorithm is applied to battery packs having different attributes, the battery charger needs to accurately identify the type of battery pack that is coupled to the battery charger. Therefore, it is desirable to develop an improved identification scheme amongst battery packs that couple to the same battery charger.

The statements in this section merely provide background information related to the present disclosure and may not constitute prior art.

SUMMARY

In one aspect of the disclosure, a method is provided for identifying a battery pack that is operably coupled to a battery charger. The method comprises: measuring voltage at a plurality of designated terminals of the battery pack while the first battery pack is coupled to the battery charger; determining how many of the designated terminals are connected to a reference voltage, such as a positive battery terminal; and identifying an attribute of the battery pack based on how many of the designated terminals are connected to the reference voltage. At least one of the designated terminals is preferably connected to a node disposed between two of the battery cells in the battery pack.

In another aspect of the disclosure, a method is presented for identifying a battery pack coupled to a battery charger. The method includes: measuring voltage at a plurality of designated terminals of the battery pack while the battery pack is coupled to the battery charger; determining location of a given terminal amongst the designated terminals; and identifying an attribute of the battery pack based on the location of the given terminal amongst the designated terminals.

In a further aspect of the disclosure, a battery pack for a portable tool includes a body having opposed first and second side walls oriented perpendicular to a body rear face. A body front face is oppositely directed with respect to the rear face. A finger notch includes an engagement wall and an oppositely positioned lead-in wall. The engagement wall and the lead-in wall are joined at a notch cavity bottom wall recessed within the body below the front face. The engagement wall has a first pitch angle with respect to the front face and the lead-in wall has a second pitch angle with respect to the front face smaller than the first pitch angle.

In yet another aspect of the disclosure, a battery pack connection system includes a printed circuit board connection member. A connector is mounted to the printed circuit board connection member and has at least one aperture. At least one biasing member having a spring leg is positioned in the at least one aperture. At least one cell wire has a connection end. An electrical connection is created by insertion of the connection end into the at least one aperture. The electrical connection maintained by a first biasing force created by elastic deflection of the connection end in a first direction by direct contact with the at least one biasing member such that the first biasing force acts in a second direction opposite to the first direction, and a second biasing force created by elastic deflection of the spring leg in the second direction from direct contact between the connection end and the at least one biasing member such that the second biasing force acts in the first direction. The spring leg and the connection end each have a different spring constant, or the same spring constant but different masses.

Further areas of applicability will become apparent from the description provided herein. It should be understood that the description and specific examples are intended for purposes of illustration only and are not intended to limit the scope of the present disclosure.

DRAWINGS

FIG. 1 is a diagram of an exemplary system of power tools;

FIG. 2 a block diagram of an exemplary configuration for a battery charger that operably couples to different types of battery packs;

FIG. 13 is a cross sectional side elevational view taken at section 13 of FIG. 12.

Figure 1:
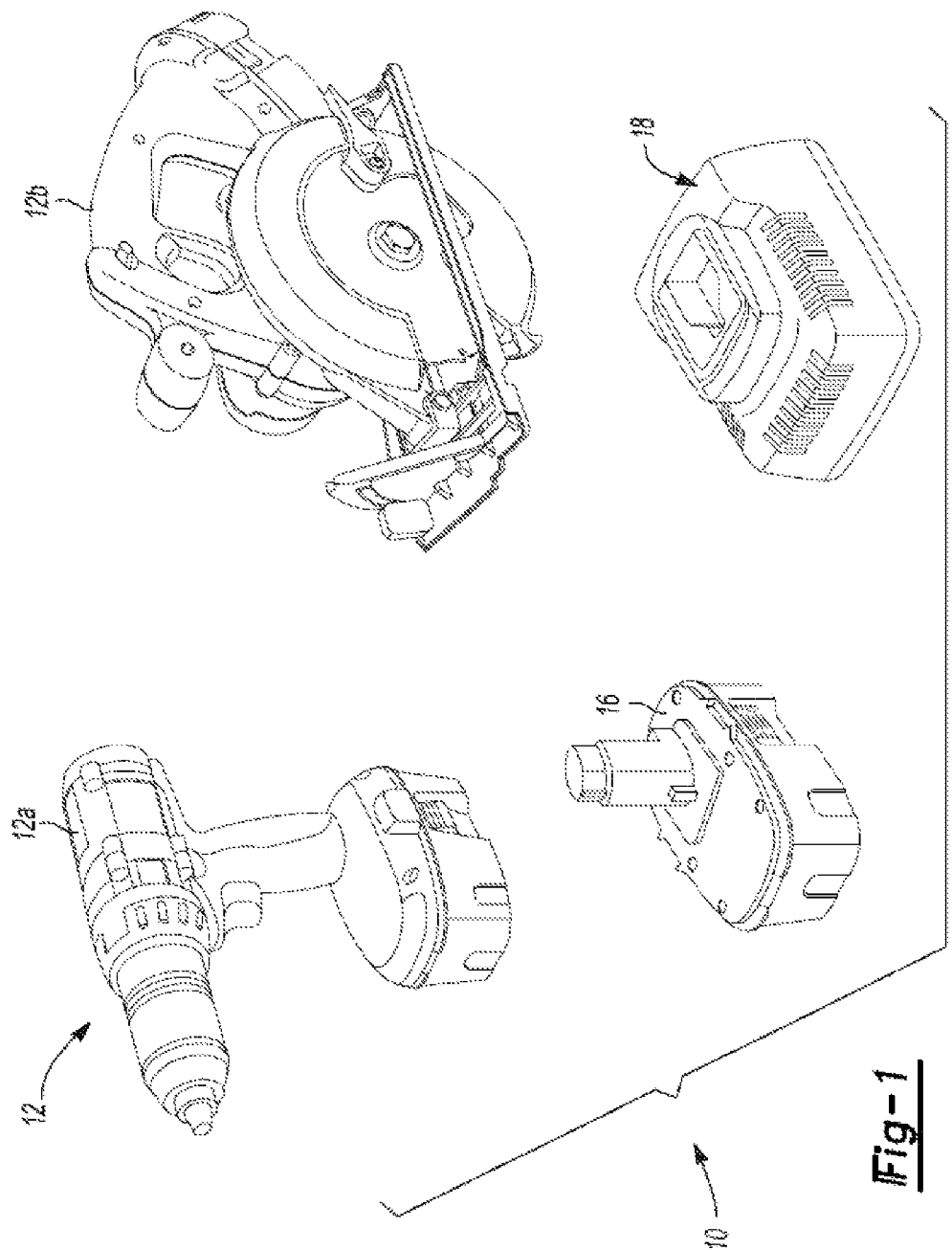

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

The present disclosure can relate to a system of power tools of the type that is generally indicated by reference numeral 10 in FIG. 1. The system of power tools 10 can include, for example, one or more power tools 12, one or more battery packs 16 and a battery pack charger 18. Each of the power tools 12 can be any type of power tool, including without limitation drills, drill/drivers, hammer drill/drivers, rotary hammers, screwdrivers, impact drivers, circular saws, jig saws, reciprocating saws, band saws, cut-off tools, cut-out tools, shears, sanders, vacuums, lights, routers, adhesive dispensers, concrete vibrators, lasers, staplers and nailers. In the particular example provided, the system of power tools 10 includes a first power tool 12a and a second power tool 12b. For example, the first power tool 12a can be a drill/driver similar to that which is described in U.S. Pat. No. 6,431,289, while the second power tool 12b can be a circular saw similar to that which is described in U.S. Pat. No. 6,996,909. A battery pack 16 can be selectively coupled to either of the first and second power tools 12a and 12b to provide electrical power thereto. It is noteworthy that the broader aspects of this disclosure are applicable to other types of battery powered devices.

Figure 2:
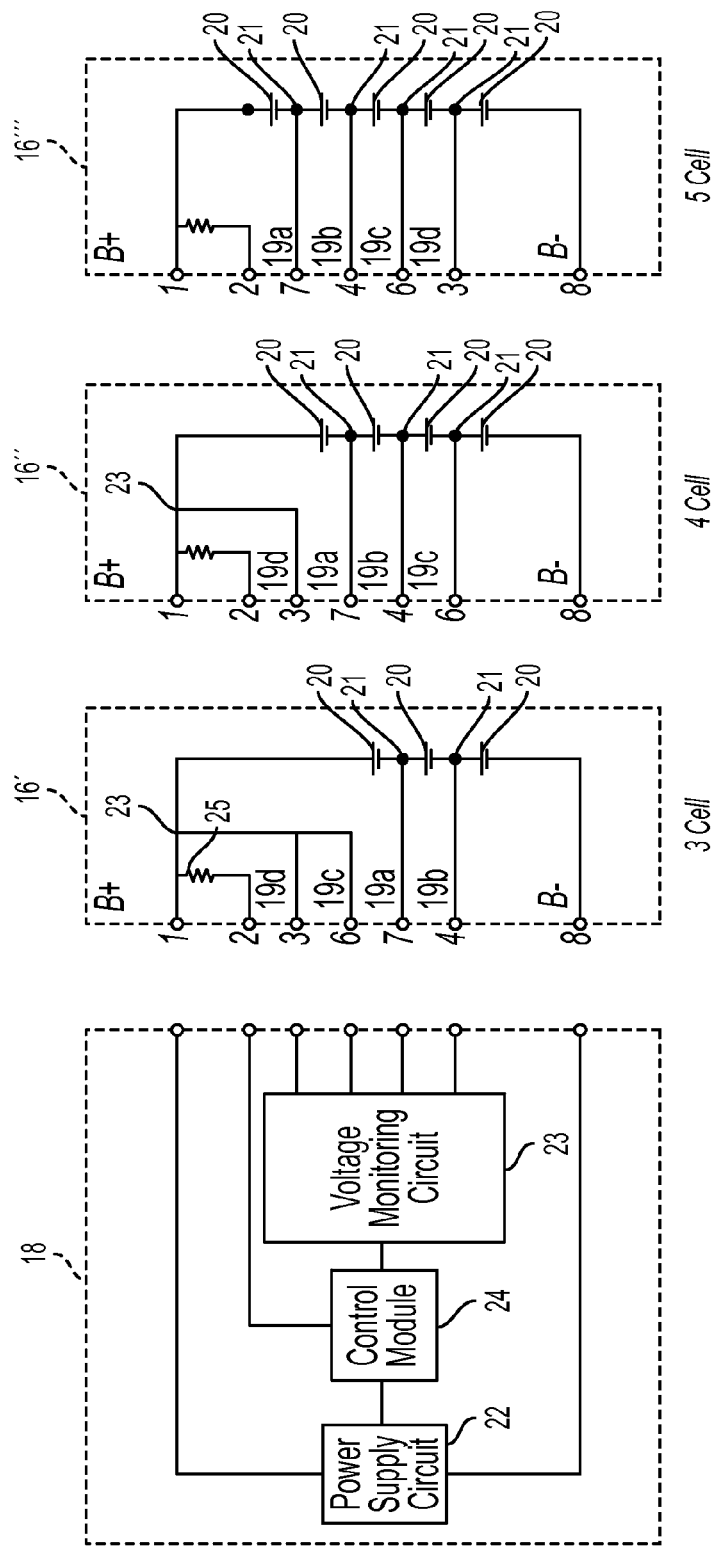

FIG. 2 illustrates an exemplary configuration of a battery charger 18 that operably couples to a plurality of different battery packs 16. The battery charger 18 is generally comprised of a power supply circuit 22 (i.e., current source), a voltage monitoring circuit 23 and a charger control module 24. The exemplary configurations are merely provided as a context for describing the identification scheme disclosed herein. Moreover, the configuration may represent only a portion of the internal circuitry. The battery pack and/or the battery charger may include additional functionality or components such as other identification components, protection circuits and/or other internal components which are not shown herein for reasons for clarity.

The charger control module 24 is responsible for charging the battery cells and monitoring any fault conditions which may develop during charging. In an exemplary embodiment, the charger control module 24 is implemented as software (processor-executable instructions) on a digital microcontroller. However, the charger control module 24 may be embodied in hardware or software as a digital microcontroller, a microprocessor or an analog circuit, a digital signal processor or by one or more digital ICs such as application specific integrated circuits (ASICs), for example. It is also contemplated that a portion of the charger control could reside in the battery pack.

To charge a battery pack 16, the pack 16 is operably coupled to the battery charger 18. Various techniques for detecting the presence of the battery pack may be employed. Upon detecting the battery pack 16, the battery charger 18 initiates a charging scheme. In an exemplary charging scheme, the charger 18 delivers a constant current to the battery pack 16. When the stack voltage, an individual cell or a portion of the cells reaches a target charging value, the charger 18 switches from a constant current mode to a constant voltage mode. The charger 18 continues charging in constant voltage mode until the charge current drops below a predefined threshold (e.g., 100 mA) at which time the charge current is terminated.

Figure 3:
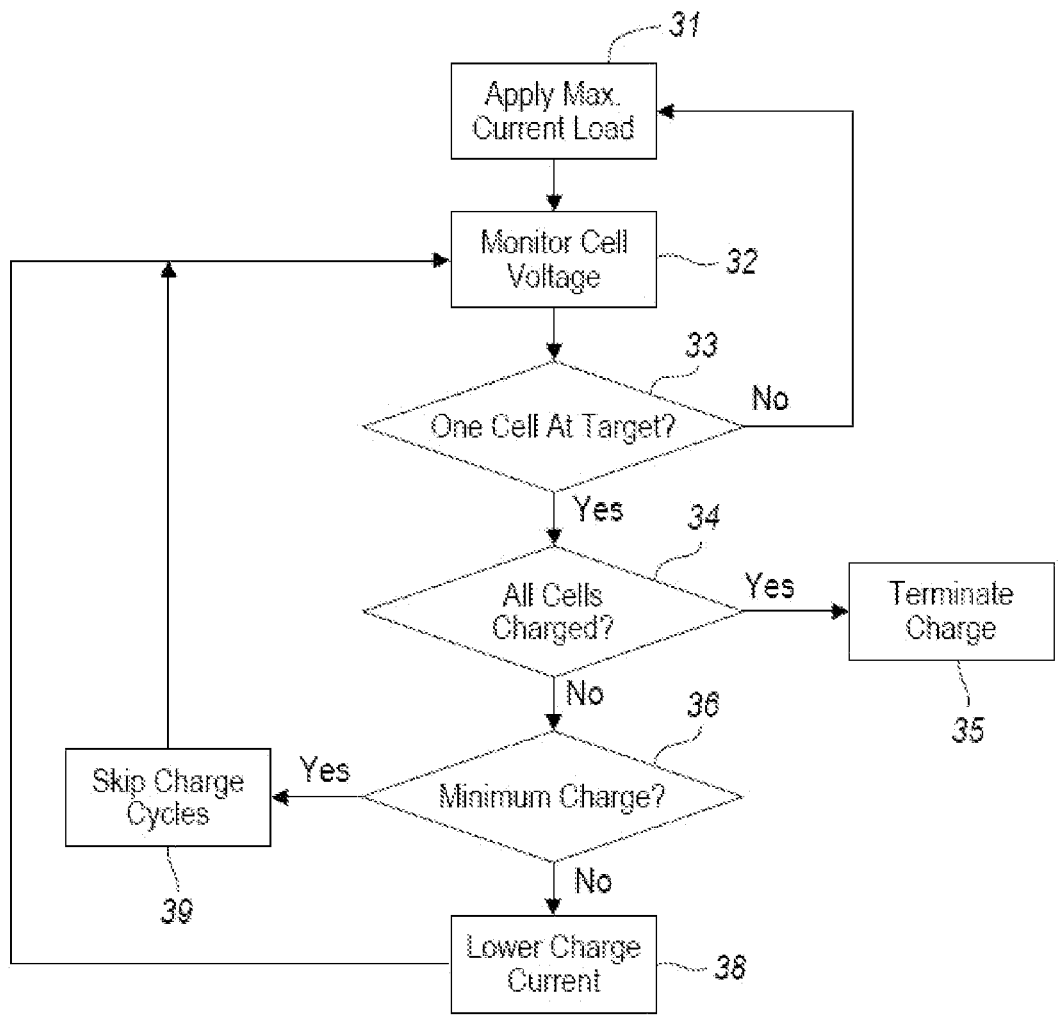
FIG. 3 is a flowchart illustrating an exemplary charging scheme according the present disclosure.

FIG. 3 illustrates another exemplary charging scheme which may be implemented by the charger control module 24 of the charger 18. In this scheme, the battery charger 18 begins by delivering a charge current 31 to the battery pack. The charge current may be set at a maximum value which can be delivered by the charger (e.g., 3 amps) or some lesser value. In some embodiments, the charge current may be delivered in periodic charge cycles (e.g., cycles of one second duration); whereas, in other embodiments, the charge current is delivered in continuously.

Cell voltages are continually being monitored at step 32 via the voltage monitoring circuit 23 during the charging process. In the exemplary embodiment, the cell voltage measurements can be made between charge cycles by the voltage monitoring circuit 23. The voltage monitoring circuit 23 is preferably configured to take individual cell measurements in a sequential manner during a span, e.g., of about 10-70 milliseconds. Individual cell measurements are in turn reported to the charger control module 24 for further assessment. In the case that the charge current is delivered continuously, cell voltage measurements are taken while the charge current is being delivered to the battery cells.

The maximum charge current will continue to be delivered to the battery pack until at least one of the battery cells reaches a target charging value (e.g., 4.15 volts) as indicated at step 33. When one or more of the battery cells reaches the target charging value, the charge current will be lowered. In an exemplary embodiment, the charge current is lowered in predefined increments at step 38 until it reaches a minimum charge current (e.g., 200 mA) that can be output by the charger. For example, the charge current may be reduced in half although other decrements are also contemplated.

The average charge current delivered to the battery cells may be lowered further by skipping charge cycles. When the charger is outputting a minimum charge current and less than all of the cells have reached the target charge value, charge cycles are skipped at step 39 to further lower the average charge current delivered to the cells. For example, skipping every other charge cycle further reduces the average charging current being delivered by the charger by 50% (e.g., from 200 mA to an average of 100 mA).

After each charge cycle, cell measurements are taken and a determination is made as to whether to lower the charge current. In the exemplary embodiment, the determination to lower the charge current is made by the charger control module 24. In response to this command, the charger control module 24 interfaces with the power supply circuit 22 to lower the charge current being delivered by the charger. When all of the battery cells have reached the target charge value, the charge current is terminated as indicated at step 35. This charging scheme is particularly suitable for battery packs having cell balancing functionality. Other types of charging schemes are contemplated within the broader aspects of this disclosure.

The battery charger 18 may be configured to charge different types of battery packs 16. For example, the battery packs 16', 16", 16''' may have different number of battery cells and nominal voltage ratings, such a 12 volt, 14.4 volt, and 20 volt, respectively. In each case, the battery pack 16 includes a plurality of battery cells 20 connected in series (as shown), or multiple strings of cells connect in parallel with one another in which the cells in a given string are connect in series with each other. The number of serially-connected cells determines the nominal voltage rating for the battery pack. It is readily understood that other voltage ratings fall within the scope of this disclosure. For purposes of describing the exemplary embodiments, the battery pack 16 may be composed of cells having lithium-ion cell chemistry. Likewise, it is understood that the battery pack 16 may be composed of cells of another lithium-based chemistry, such as lithium metal or lithium polymer, or another chemistry such as nickel cadmium (NiCd), nickel metal hydride (NiMH) and lead-acid, for example.

The battery packs 16 may further include a temperature sensor 25. The temperature sensor 25 is configured to measure the temperature of the battery cells. The temperature sensor 25 is in turn connected via a terminal to battery control module 24 when the battery pack 16 is operably coupled to the battery charger 18. The temperature sensor 25 may be implemented with a negative temperature coefficient (NTC) thermistor, a positive temperature coefficient (PTC) thermistor, temperature sensing integrated circuits, thermocouples, or other temperature sensitive components. Other types of protection circuits may also be incorporated into the battery packs.

Figure 4A:
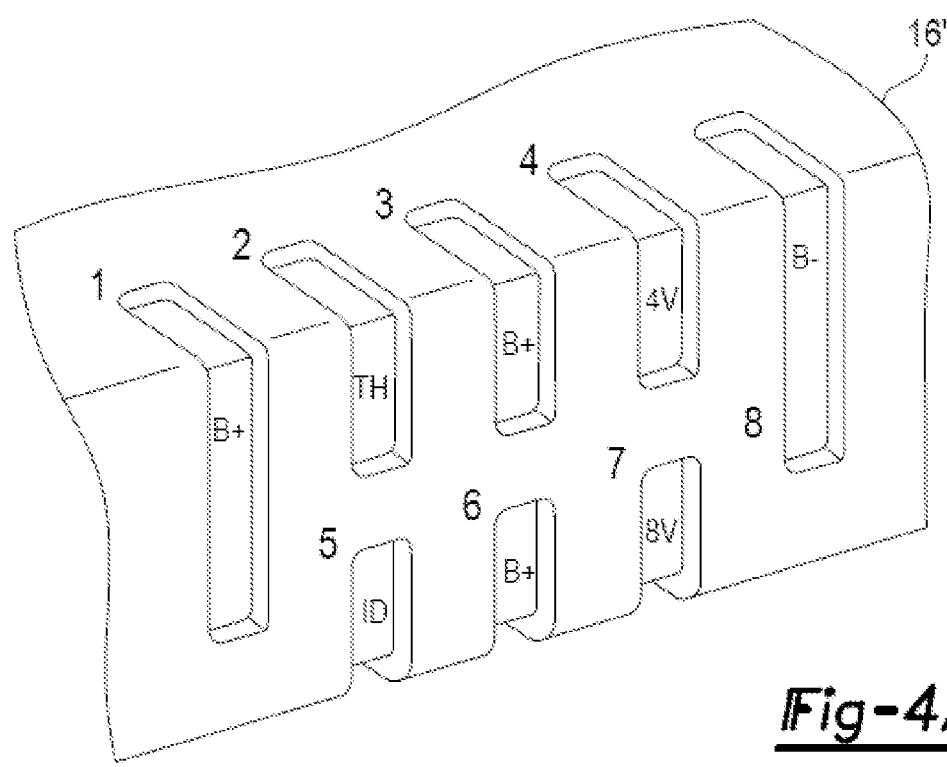
FIGS. 4A-4C are diagrams of exemplary terminal arrangements for three different types of battery packs.
Figure 4B:
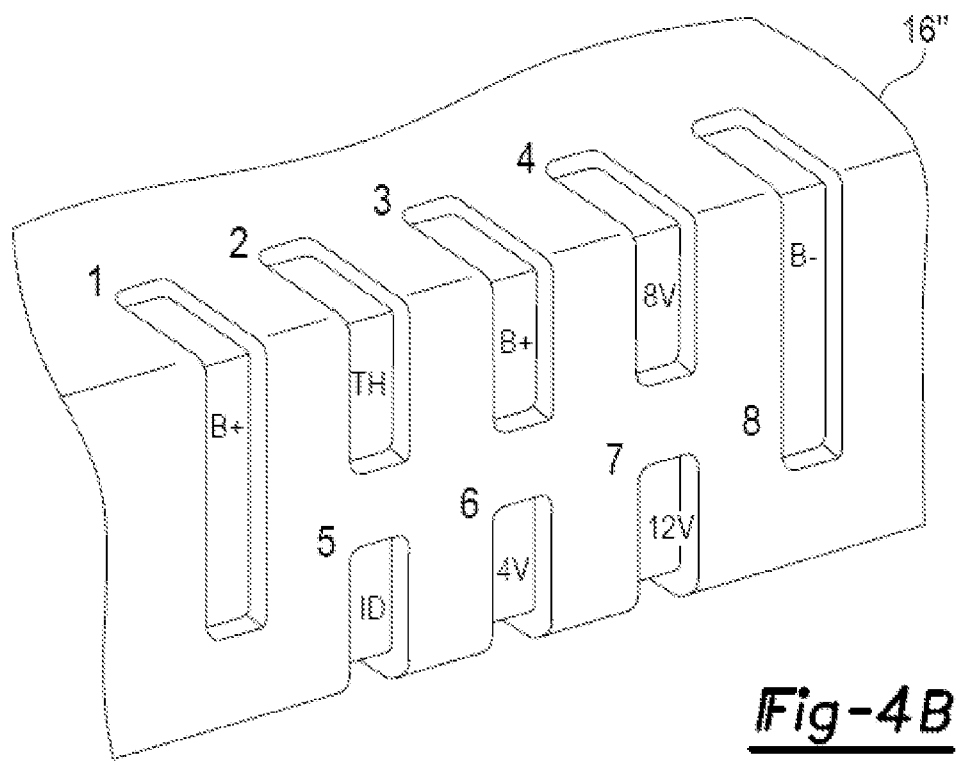
Figure 4C:
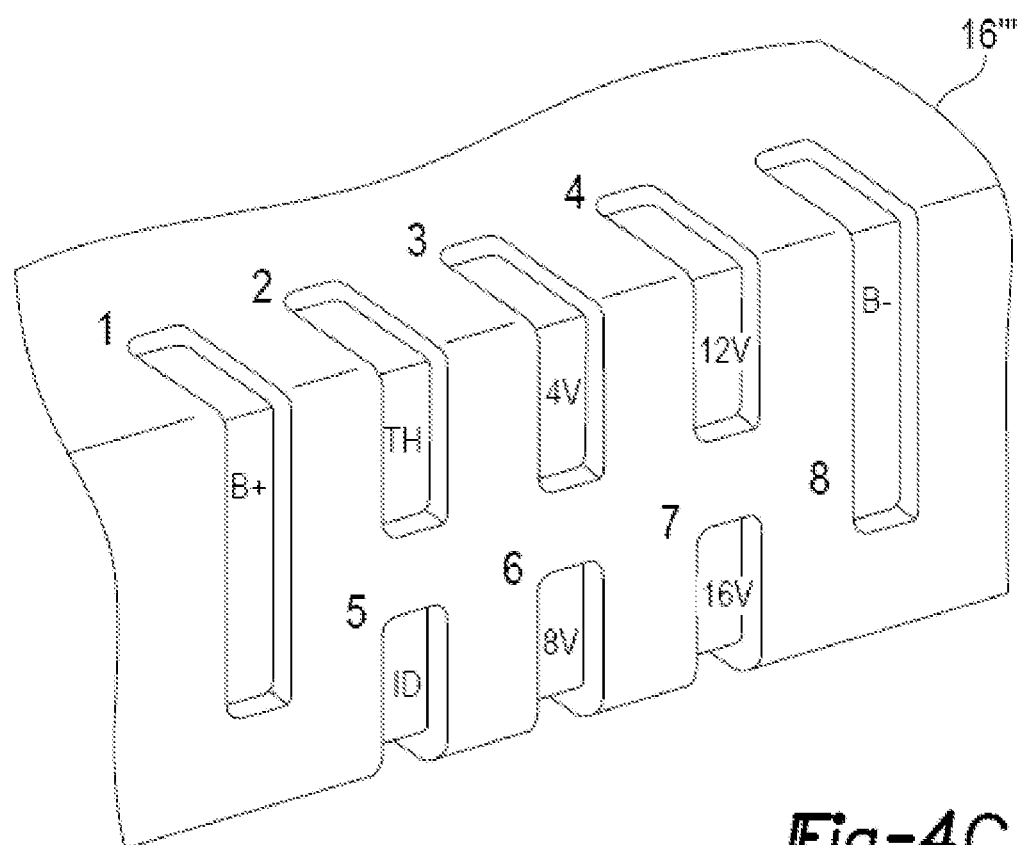

FIGS. 4A-4C illustrate exemplary terminal arrangements for three battery packs 16', 16", 16'" having different numbers of battery cells. Depending on cell chemistry and manufacturer, each battery pack will have a different nominal voltage rating, e.g., 12 volt, 14.4 volt, and 20 volt, respectively. In this exemplary embodiment, each battery pack includes eight terminals that engage electrical contacts of the battery charger. Four of the terminals are the same amongst the three packs: a positive voltage terminal (B+), a negative voltage terminal (B−), a thermistor terminal (Th) and a secondary identification terminal (ID). The remaining four terminals 19 enable voltage measurements to be taken between the battery cells in the battery pack at a measurement node 21. In the 20 volt battery pack 16'", there are five battery cells connected in series and thus four measurement nodes 21 are interspersed between the five cells as best seen in FIG. 2. In this case, each measurement node 21 is connected to one of the four remaining terminals 19 (also referred to herein as designated terminals), thereby enabling the battery charger to determine individual cell voltages of each cell 20 in the battery pack 16'". In the 14.4 volt battery pack 16", there are four battery cells 20 and thus three measurement nodes 21 connected to three of the four remaining terminals 19 such that one terminal 19 is unused. In the 12 volt battery pack 16', there are three battery cells 20 and thus two measurement nodes 21 connected to two of the four remaining terminals 19 such that two terminals 19 are unused. Thus, there is at least one of the designated terminals 19 in each of the battery packs connected to a measurement node 21 disposed between two of the battery cells 20 in the battery pack 16. It is readily understood that the terminal arrangement can include more or less terminals and the terminals may serve other functions. It is further noted that voltages shown in FIGS. 4A-4C are merely exemplary and provided to help understand the identification schemes discussed below.

Figure 5:
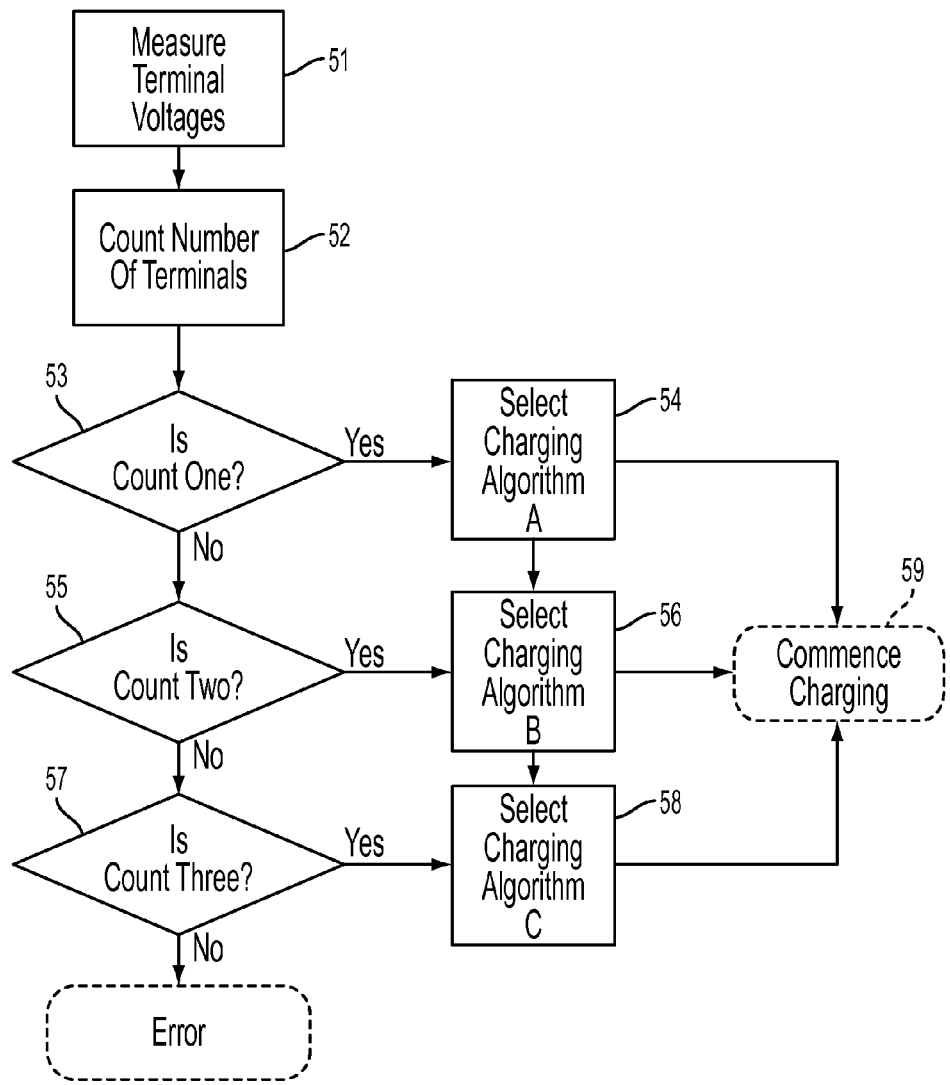
FIG. 5 is a flowchart illustrating an exemplary method for identifying a battery pack coupled to a battery charger.

Prior to charging a given battery pack 16, the battery charger 18 identifies the type of battery pack that is coupled thereto as shown in FIG. 5. In one exemplary identification scheme, the charger 18 identifies the battery pack based upon the number of terminals 19 connected to a reference voltage 23. With continued reference to the battery packs 16 described above, unused terminals in battery packs 16' and 16" can be tied to a battery reference voltage 23 as best seen in FIG. 2. More specifically, the unused terminals are connected to the positive voltage terminal (B+) of the battery pack 16. In this way, the unused terminals 19 can be used to identify the battery pack. Other reference voltages are contemplated by this disclosure.

To identify the pack type, the charger control module 24 first measures voltage at step 51 at a plurality of designated terminals (e.g., terminals 3, 4, 6 and 7) of the battery pack. Given the voltage measurements for each terminal 19, the charger control module determines at step 52 how many of the designated terminals 19 are connected to the battery reference voltage. In this example, designated terminals 19 are connected to the positive battery voltage (B+). The type of battery pack can then be determined based on the number of designated terminals 19 that are connected to the reference voltage, e.g., in the manner set forth below.

In the exemplary embodiment, when the charge control module 24 determines at 53 that only one of the terminals is connected to B+(or none of the designated terminals 19), the battery charger is presumed to be coupled to the pack 16'" having five battery cells. The charge control module 24 in turn selects a charging algorithm at step 54 suitable for charging the identified battery pack 16'". Alternatively, the charge control module 24 may set parameters (e.g., an overcharge voltage threshold for the total pack) in a generic charging algorithm that is suitable for the identified battery pack 16'". The charge control module 24 can then interact with the power supply circuit 22 to commence charging at step 59 in accordance with the appropriate charging algorithm.

When the charge control module 24 determines at step 55 that two terminals are connected to B+ (or one designated terminal 19, i.e., terminal 3), the battery charger 18 is presumed to be coupled to the battery pack 16" having four cells. When the charge control module 24 determines at step 57 that three terminals are connected to B+ (or two designated terminals, i.e., terminals 3 and 6), the battery charger 18 is presumed to be coupled to the battery pack 16' having three cells. In either case, the charge control module 24 selects the appropriate charging algorithm 56, 58 for the identified battery pack and commences charging as indicated at step 59. It is readily understood that the charging algorithms selected can vary for the different pack types. It is further envisioned that the identification scheme set forth above could be used in conjunction with other means for identifying the type of battery pack that is coupled to the battery charger.

With continued reference to FIGS. 4A-4C, another method for identifying the type of battery pack is described. In each of the packs, there is a terminal (designated as 4v in the figures) that is coupled to a measurement node disposed between the first battery cell and the remainder of the battery cells. By changing the location of this terminal amongst the three different packs, the location of this terminal can be used to identify the pack type.

Figure 6:
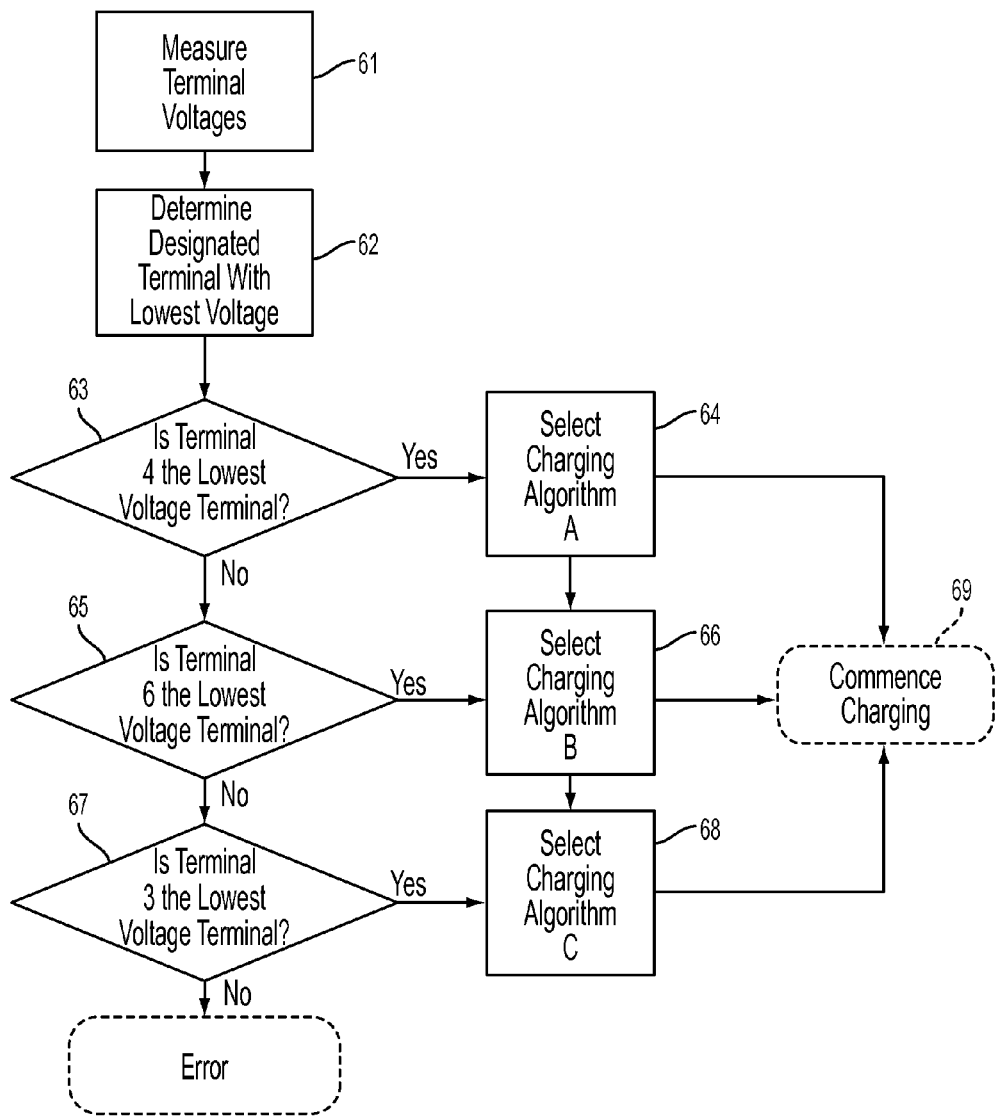
FIG. 6 is a flowchart illustrating another exemplary method for identifying a battery pack coupled to a battery charger.

Referring to FIG. 6, the charger control module 24 first measures voltage 61 at a plurality of designated terminals (e.g., terminals 3, 4, 6 and 7) of the battery pack. Given the voltage measurements for each designated terminal, the charger control module 24 determines at step 62 which designated terminal has the lowest voltage measure. While the terminal with the lowest voltage measurement will be approximately 4 volts in a fully charged condition, it is readily understood that regardless of the stated charge of the pack 16 the lowest voltage terminal will be the same. The type of battery pack can then be determined based on the position of the lowest voltage terminal. It is envisioned that this approach can be applied to one of the other terminals, such as the terminal with the second lowest voltage measure or the terminal connected to the thermistor.

In the exemplary embodiment, when the charge control module 24 determines at step 63 that terminal 4 has the lowest voltage measure, the battery charger is presumed to be coupled to the pack 16' having three cells. The charge control module 24 in turn selects a charging algorithm at step 64 suitable for charging the pack 16'. Alternatively, the charge control module 24 may set parameters (e.g., an overcharge voltage threshold for the total pack) in a generic charging algorithm that is suitable for the pack 16'. The charge control module can then commerce charging in accordance with the appropriate charging algorithm as indicated at 69.

When the charge control module determines at 65 that designated terminal 6 has the lowest voltage measure, the battery charger is presumed to be coupled to the pack 16″ having four cells. When the charge control module determines at 67 that terminal 3 has the lowest voltage measure, the battery charger is presumed to be coupled to the pack 16′″ having five cells. In either case, the charge control module selects the appropriate charging algorithm 66, 68 for the identified battery pack and commences charging as indicated at step 69.

While the identification schemes set forth above are used to determine the nominal voltage of the battery pack, the scheme could be used to identify other attributes of a battery pack. For instance, the identification scheme could be used to distinguish between packs having different cell chemistry. Other types of attributes, such as cell chemistry, cell supplier or cell arrangement (i.e., number of parallel cell strings) are also contemplated by this disclosure. It is further contemplated that these identification schemes could be implemented by a controller into a tool such that the tool identifies attributes of the battery pack coupled thereto.

Figure 7:
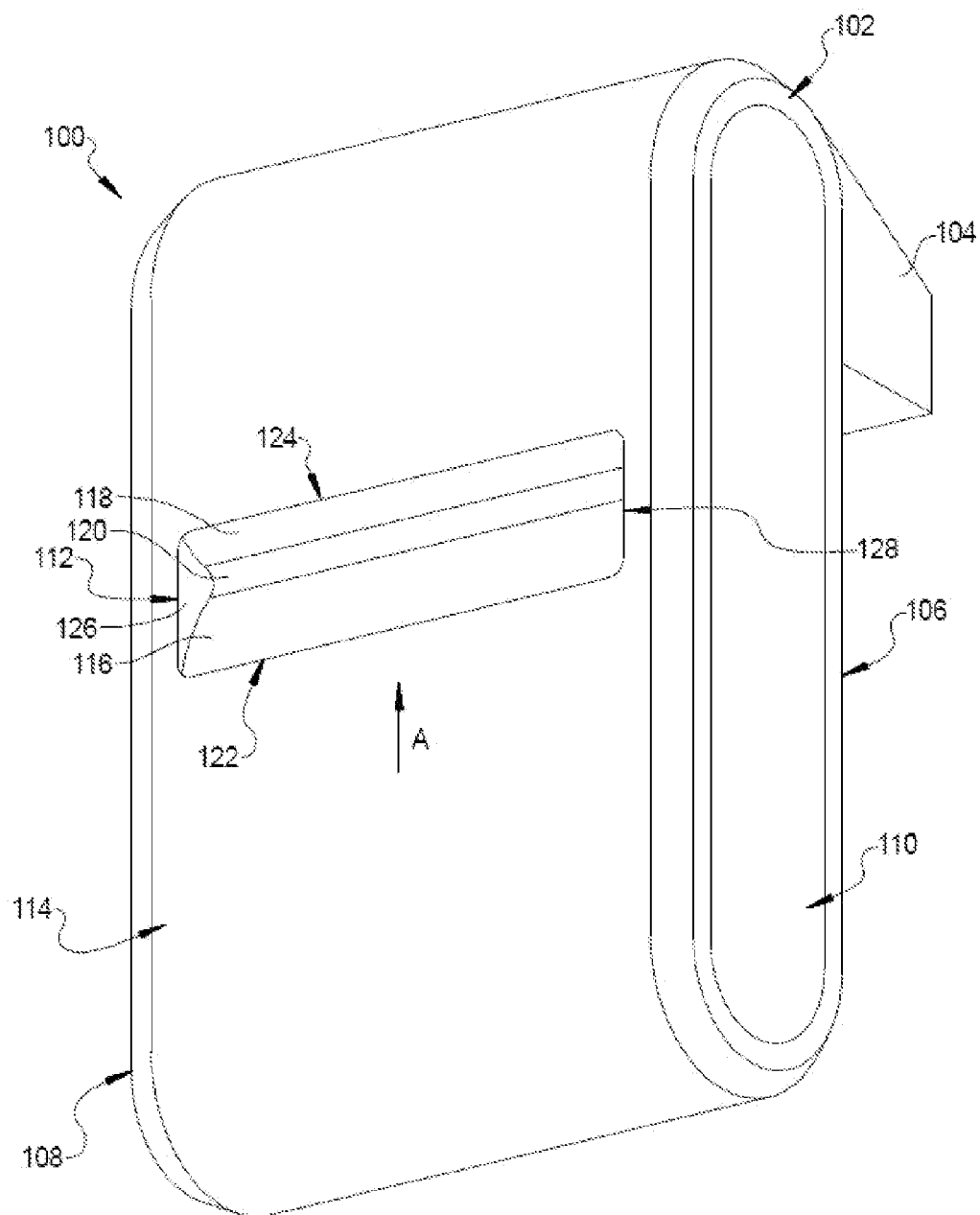
FIG. 7 is a front right perspective view of an embodiment of a battery pack having a female recessed finger notch.

Referring to FIG. 7, a battery pack 100 includes a body 102 having a generally rectangular shape, and can include a connection port 104 extending from a rear face 106 used to connect battery pack 100 for charging or to a tool (not shown) for use of the charge stored in battery pack 100. Opposed first and second side walls 108, 110 are oriented perpendicular to the rear face 106. To assist in manually installing and/or removing battery pack 100 with respect to a recharging device or a tool, a recessed, female finger notch 112 is provided defining an opening into body 102 from a front face 114. Front face 114 is substantially planar but may include fascia features, manufacturer labels, instructions for use and recharging, battery pack ratings, and the like, either embossed, recessed, stamped, tagged, or otherwise provided with front face 114.

According to several embodiments, finger notch 112 includes a lead-in wall 116 and an oppositely positioned engagement wall 118, which are joined at a notch cavity bottom wall 120 recessed below the front face 114. The lead-in wall 116 can define a convex-shaped curve directly outwardly. Finger notch 112 is employed by a user inserting one or more fingers (not shown) into finger notch 112 by initially sliding the fingers in a first operating direction "A" along front face 114 until a lead-in edge 122 of lead-in wall 116 is encountered. The user's fingers thereafter enter downwardly (away from the viewer in FIG. 7) into finger notch 112 and continue to slide along lead-in wall 116 until reaching both bottom wall 120 and contacting engagement wall 118. Continued pressure applied by the user's fingers in the first operating direction "A" is then transferred by direct contact substantially through engagement wall 118 to displace battery pack 100 in the first operating direction "A". Opposed finger notch end walls 126, 128 are oriented perpendicular to front face 114 and the notch cavity bottom 120, and parallel to each of the first and second side walls 108, 110. Notch end walls 126, 128 provide side-to-side limits to help retain the user's fingers within finger notch 112.

Figure 8:
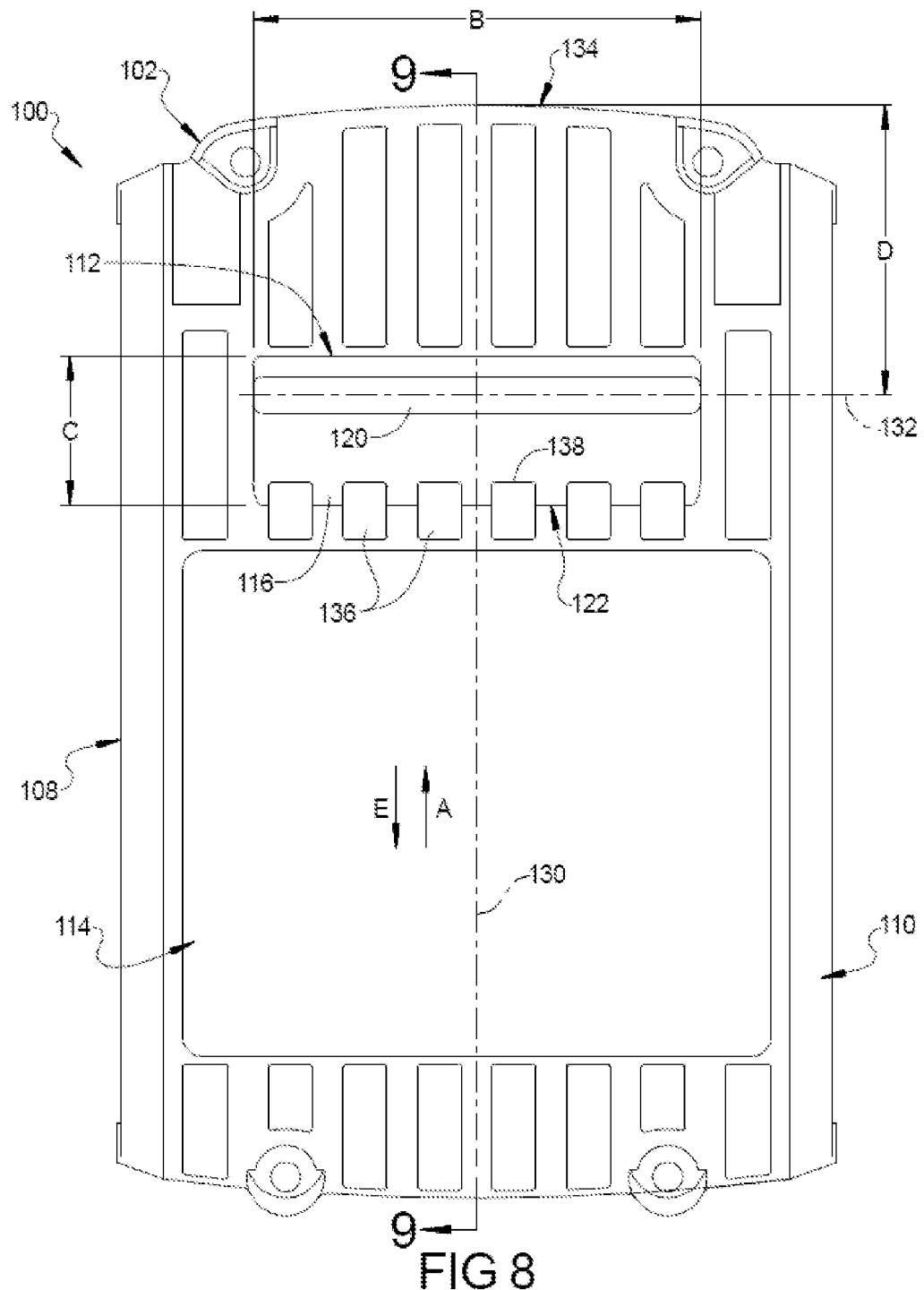
FIG. 8 is a top plan view of the battery pack of FIG. 7.

Referring to FIG. 8, finger notch 112 is oriented substantially perpendicular to first and second side walls 108, 110, and finger notch 112 has a total length "B" centered with respect to a longitudinal axis 130 of battery pack 100. A total width "C" of finger notch 112 can be approximately 15.2 mm to provide access for receiving the fingers the user. A longitudinal axis 132 of bottom wall 120 locates finger notch 112 approximately 30.2 mm from an end wall 134 of body 102 in one exemplary embodiment. To assist the user in moving battery pack 100 in a second operating direction "E", which is oppositely directed with respect to first operating direction "A", at least one and according to several embodiments a plurality of contact members 136 can integrally extend from front face 114 and can each include an extending portion 138 extending partially into finger notch 112 past lead-in wall 116. The user's fingers will directly engage contact members 136 when the fingers are moved in the second operating direction "E" to assist in moving battery pack in the second operating direction "E". The above dimensions represent one exemplary embodiment and are not intended to limit battery pack 100 or finger notches 112 of the present disclosure to any specific dimensions.

Figure 9:
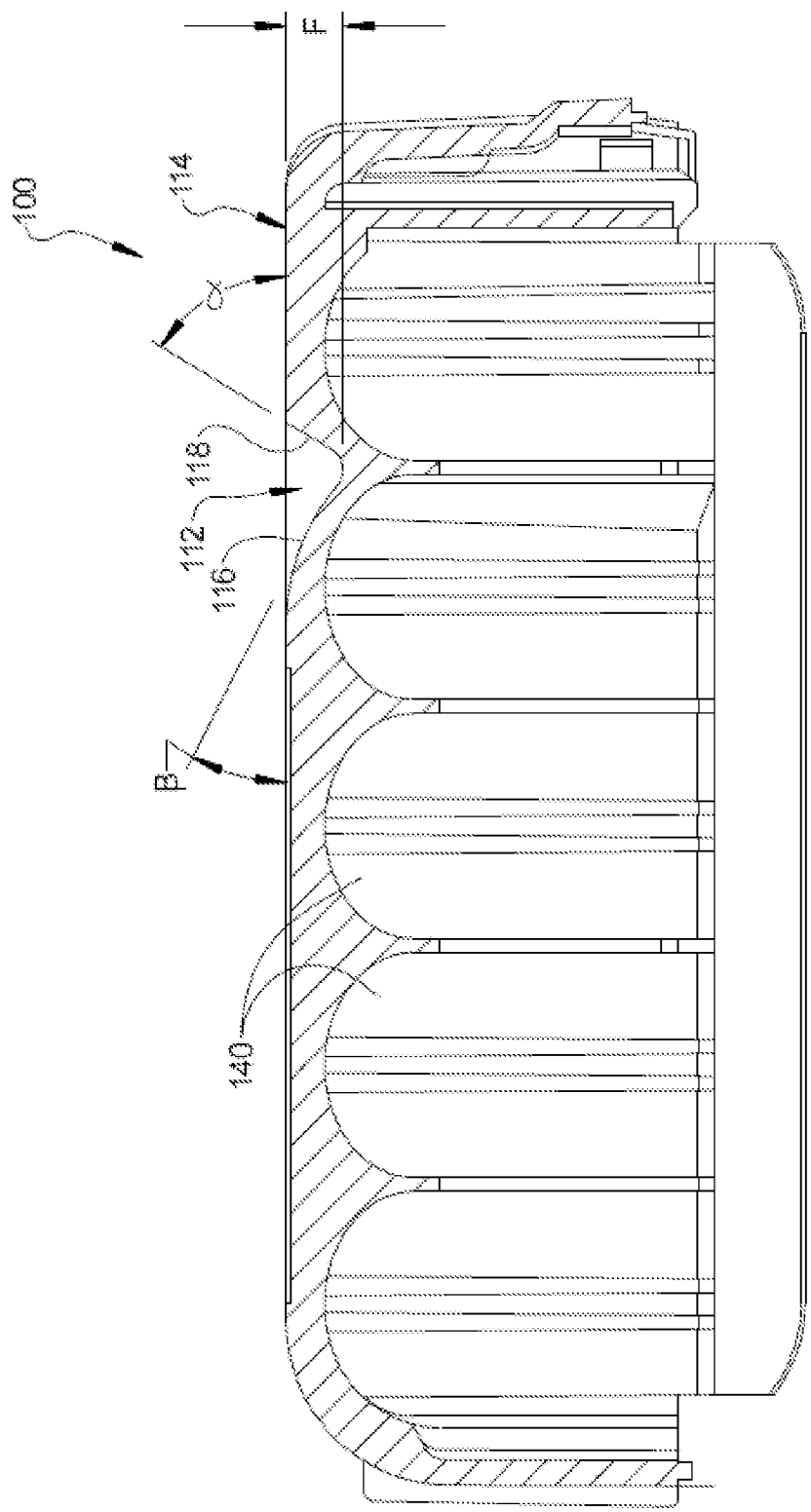
FIG. 9 is a cross sectional side elevational view taken at section 9 of FIG. 8.

Referring to FIG. 9, to maximize user engagement with finger notch 112 and the force transferred to battery pack 100 using finger notch 112 in first operating direction "A", a first pitch angle α or slope of engagement wall 118 is substantially greater than a second pitch angle β or slope of lead-in wall 116. Engagement wall 118 is oriented at angle α of approximately 60 degrees with respect to front face 114. Lead-in wall 116 is oriented at angle β of approximately 30 degrees with respect to front face 114. According to several embodiments, first pitch angle α is approximately double (2 times) or greater than second pitch angle β to ensure user direct contact with engagement wall 118. Battery pack 140 can also include multiple slots 140 sized to slidably receive and retain rechargeable batteries (not shown).

Figure 10:
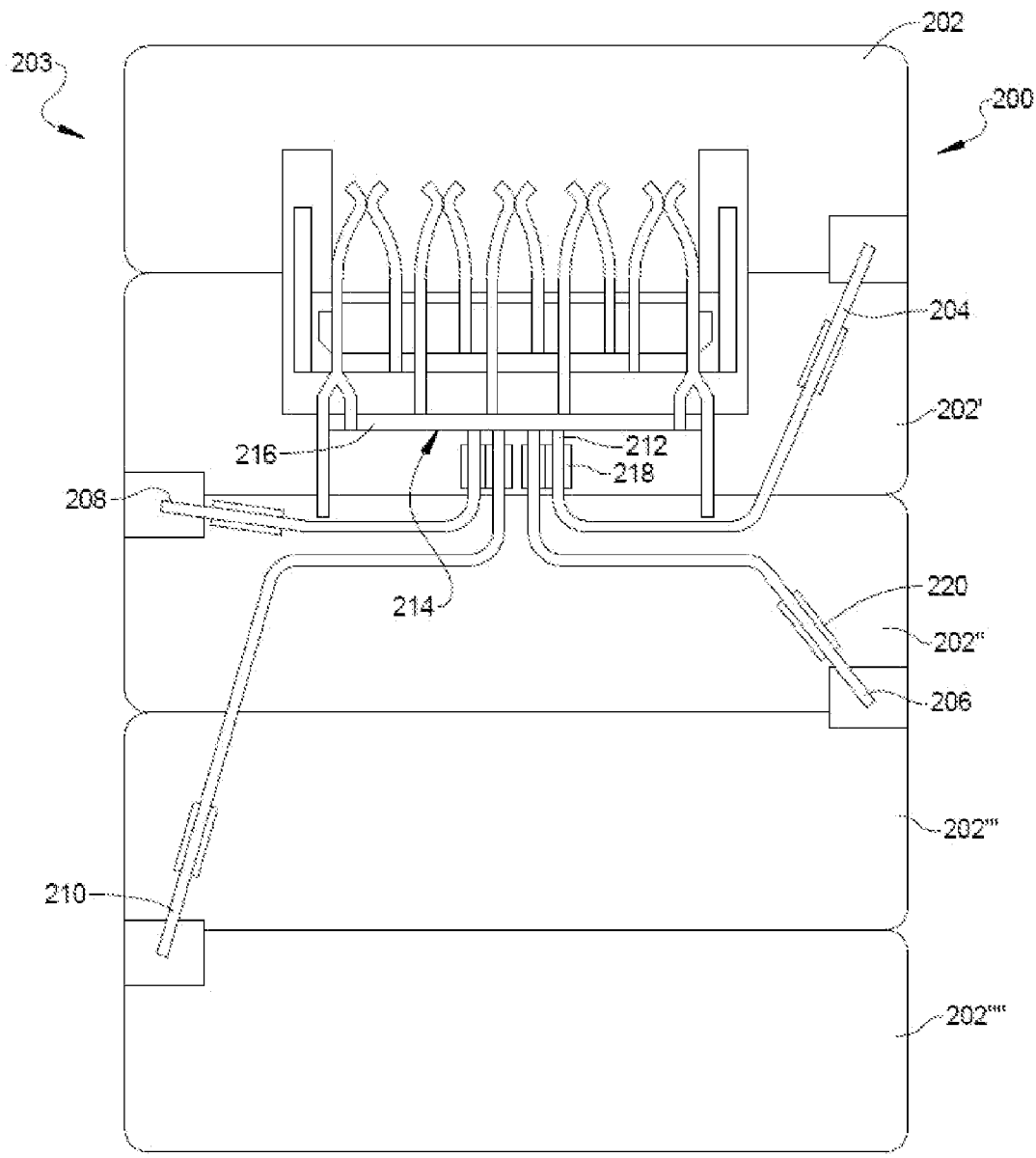
FIG. 10 is a top plan view of another embodiment of a battery pack connection system having double-biased wire connectors.

Referring to FIG. 10, a battery pack connection system 200 is used for electrical connection of a plurality of individual battery cells 202, 202', 202″, 202‴, 202⁗ of a battery pack 203. Battery pack connection system 200 can include multiple individual battery cell wires, including a first cell wire 204, a second cell wire 206, a third cell wire 208, and a fourth cell wire 210. Each of the individual cell wires are pre-formed of a substantially rigid material intended to retain a pre-formed shape prior to, during and after installation in battery pack 203. Each of the individual cell wires includes a pressure connection end 212 that is partially deflected to bias pressure connection end 212 into direct contact with a planar face 214 of a printed circuit board (PCB) contact pad 216. To maintain the pre-formed shape of each of the individual cell wires, they are also retained in an installed position by receipt in elongated slots or apertures of a connector member 218 located proximate to printed circuit board contact pad 216, and also to slots of individual remote slotted members 220 located proximate to the connection of the individual cell wires at its individual cell or cells. According to several embodiments, connector member 218 can be a single member retaining all of the individual cell wires, or can be individual members each retaining one or more of the cell wires.

Figure 11:
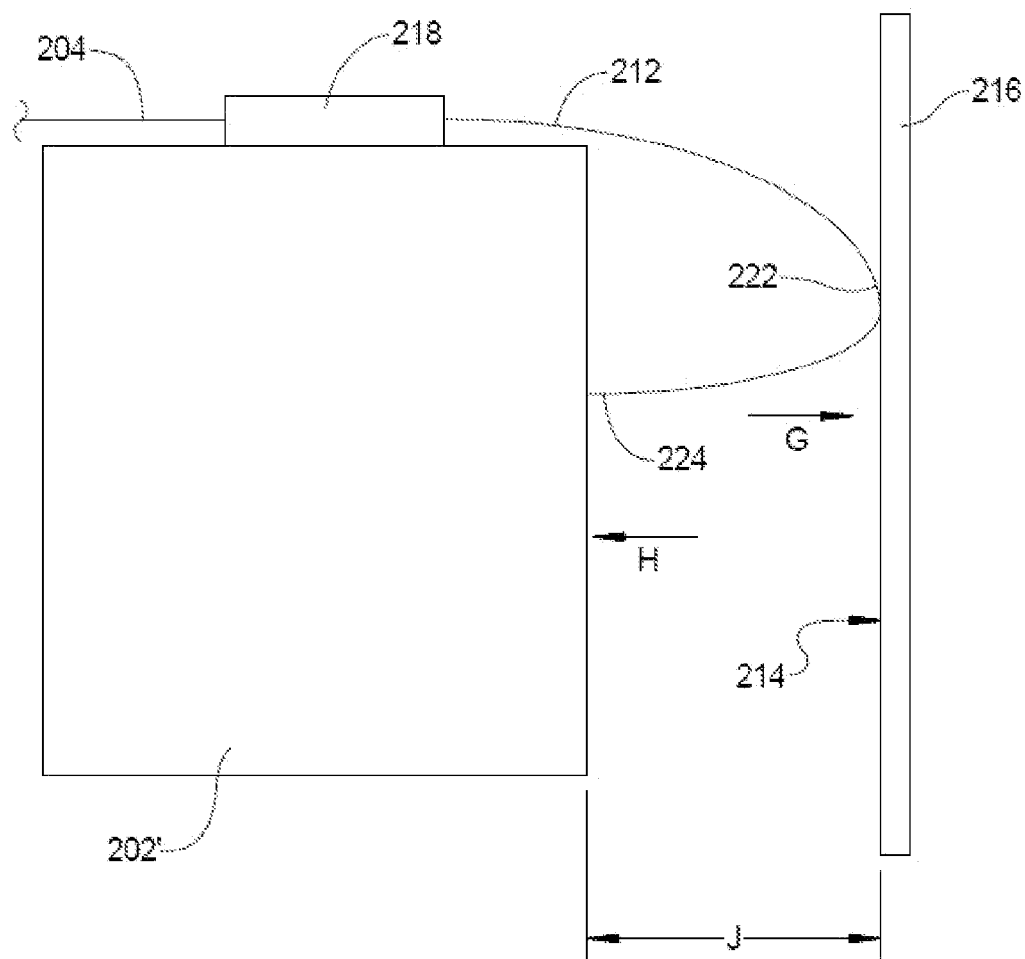
FIG. 11 is a side elevational view of the battery pack of FIG. 10.

Referring to FIG. 11, the slotted members 218 individually retain the first, second, third and fourth cell wires 204, 206, 208, 210 (only first cell wire 204 is clearly visible in this view) in an exemplary embodiment connected to battery 202'. The pressure connection end 212 of each cell wire is formed as a bent or formed partial loop extending from each of the connector slotted members 218. Each pressure connection end 212 includes a first portion 222 directly contacting the planar face 214 of PCB contact pad 216, and a second portion 224 directed back toward battery 202'. According to several embodiments, each pressure connection end 212 defines a bend ranging from less than 90 degrees to approximately 180 degrees.

Pressure connection ends 212 are intended to help mitigate against vibration of battery pack 203 causing contact between first portion 222 and planar face 214 of PCB contact pad 216 to become intermittent, for example if battery pack or pressure connection end 212 vibration reaches a resonant frequency. To accomplish this function, each pressure connection end 212 is created with a different spring constant for each of the first and second portions 222, 224, or the first and second portions 222, 224 can each have the same spring constant but a different mass. The first spring constant of first portion 222 together with its geometry as a U-shaped bend results in a biasing force acting in a first biasing direction "G" created when first portion 222 elastically deflects when directly contacting planar face 214. Second portion 224 has a second spring constant different than the first spring constant, or as noted above the first and second portions 222, 224 can each have the same spring constant but a different mass. The second spring constant of second portion 224 results in a biasing force acting in a second biasing direction "H" opposite to first biasing direction "G" and resulting when second portion 224 contacts battery or cell 202'. A spacing dimension "J" between battery 202' and planar face 214 is predetermined such that if either first portion 222 or second portion 224 of pressure connection end 212 vibrates at its natural frequency, contact will be maintained between pressure connection end 212 and planar face 214 to maintain electrical connectivity.

Figure 12:
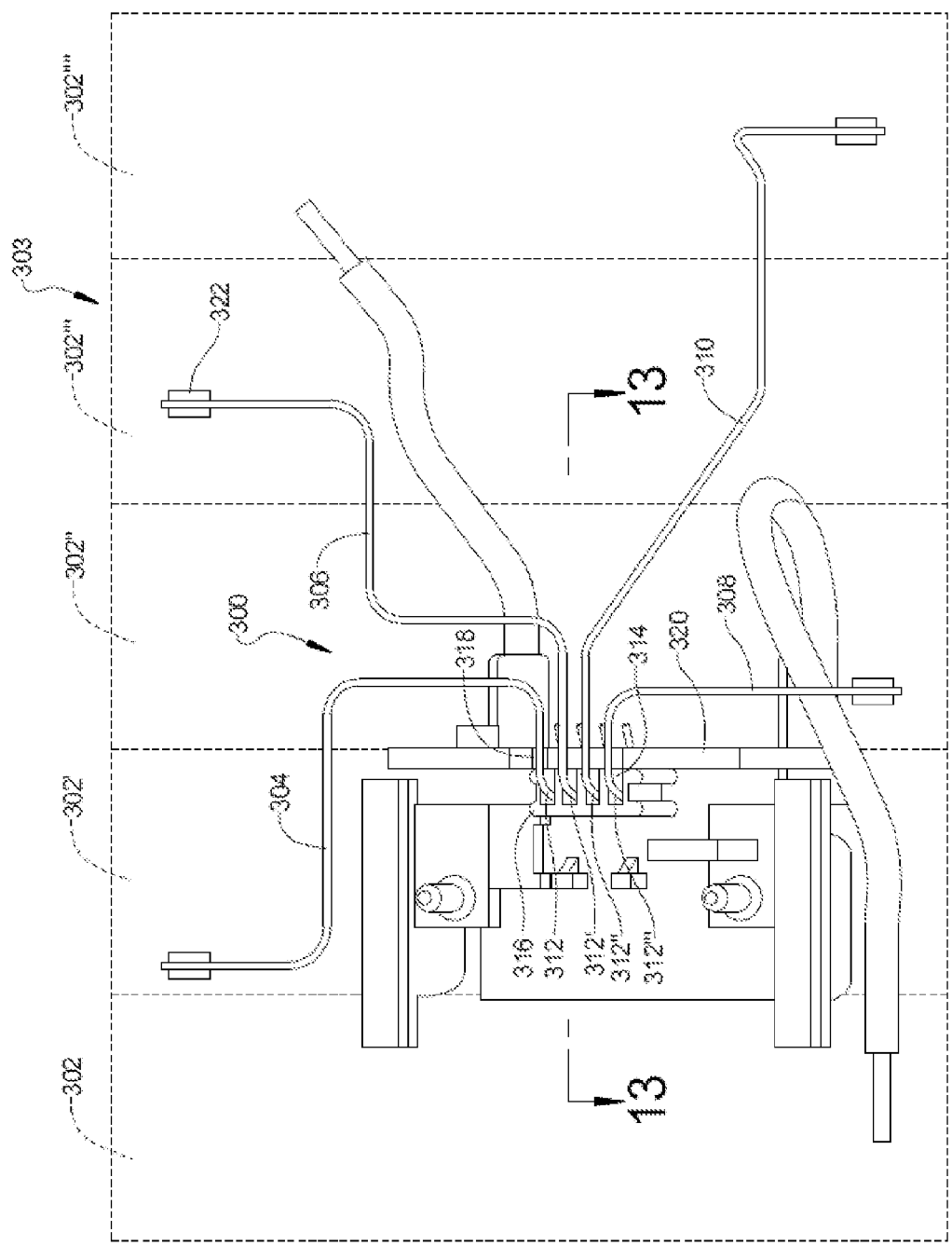
FIG. 12 is a top plan view of a further embodiment of a battery pack connection system having opposed biasing members.

Referring to FIG. 12 and again to FIG. 10, a battery pack connection system 300 is used for electrical connection of a plurality of individual battery cells 302, 302', 302", 302''', 302'''' of a battery pack 303. Battery pack connection system 300, similar to battery pack connection system 200, can include multiple individual battery cell wires, including a first cell wire 304, a second cell wire 306, a third cell wire 308, and a fourth cell wire 310. Each of the individual cell wires are pre-formed of a substantially rigid material intended to retain a pre-formed shape prior to, during and after installation in battery pack 303. Each of the individual cell wires includes a pressure connection end 312 each inserted into one of a plurality of receiving apertures 314 of a polymeric connector 316. To maintain the pre-formed shape of each of the individual cell wires, they can also be individually retained in an installed position by receipt in elongated slots of individual connector slotted members 318 (only one is shown) similar to connector slotted members 218 each mounted to a printed circuit board (PCB) connection member 320, and also to slots of individual remote slotted members 322, similar to remote slotted members 220 and located proximate to the cell wire connection at the individual cells.

Referring to FIG. 13, pressure connection ends 312 are intended to mitigate against vibration of battery pack 303 causing contact between pressure connection ends 312 and a connection terminal 324 providing electrical contact with (PCB) connection member 320 to become intermittent, for example if battery pack or pressure connection end 312 vibration reaches a resonant frequency. To accomplish this goal, each pressure connection end 312 is retained using two opposed biasing forces.

The following discussion of installation of pressure connection end 312' applies equally to each of the pressure connecting ends 312. The first biasing force is created when pressure connection end 312' is inserted into one of the receiving apertures 314' of connector 316. The pressure connection end 312' is inserted in a direction "K" and received in a cavity 326 created between a spring leg 328 of a generally U-shaped biasing member 330 and a wall 332 of connector 316. This forces pressure connecting end 312' to elastically deflect in a first direction "L" which creates an opposite biasing force from connecting end 312' acting in a second direction "M" maintaining direct contact between connecting end 312' and spring leg 328. The second biasing force is provided by spring leg 328, which is elastically deflected in the second direction "M" when pressure connecting end 312' is received, thereby creating a biasing force acting in the first direction "L". A spring constant of pressure connecting end 312' and of spring leg 328 are different from each other, such that vibration causing deflection of either pressure connecting end 312' or spring leg 328 at a natural frequency of either one will not result in vibration at the natural frequency of the other.

Biasing member 330 further includes a connecting end 334 which is fixed to a leg 336 of the connection terminal 324. Connection terminal 324 extends outwardly through an aperture 338 created through PCB connection member 320. A non-linear portion 340 can be positioned at least partially within aperture 338 to retain the position of connection terminal 324. According to several embodiments, the connecting end 312 of any of the plurality of cell wires 304, 306, 308, 310 is oriented at an angle α with respect to the cell wire. Angle α is preferably less than 90 degrees to permit only a free end 342 of the connecting end 312 to contact wall 332 to help retain the biasing force of connecting end 312.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A battery pack system, comprising:
   a set of battery packs, the set of battery packs including L battery packs, each battery pack of the set of battery packs including a different number M of battery cells, where $2 \leq M \leq N$ and where $L \geq 2$ and $N > L$, where N is a whole number;
   each battery pack of the set of battery packs including a set of battery terminals, each set of battery terminals including O battery terminals, where $O < N$;
   each set of battery terminals including a first subset of battery terminals, wherein each first subset of battery terminals has a different number P of battery terminals, where $0 \leq P < O$, and each battery terminal of the first subset of battery terminals is coupled to a first battery reference node, and
   each set of battery terminals including a second subset of battery terminals, each second subset of battery terminals including Q battery terminals, where $Q = O - P$, and each battery terminal of the second subset of battery terminals is coupled to a battery measurement node.

2. The battery pack system of claim 1, wherein the first battery reference node is a battery positive voltage node.

3. The battery pack system of claim 1, wherein the battery measurement node is a node between battery cells.

4. The battery pack system of claim 1, wherein L=3 and N=5 and O=4.

5. A battery pack comprising:
   a set of battery terminals, the set of battery terminals including O battery terminals,
   a first subset of the set of battery terminals, the first subset of battery terminals including P battery terminals, where 0≤P<O, and each battery terminal of the first subset of battery terminals is coupled to a first battery reference node, and
   a second subset of the set of battery terminals, the second subset of battery terminals including Q battery terminals, where Q=O−P, and each battery terminal of the second subset of battery terminals is coupled to a battery measurement node.

6. The battery pack of claim 5, further comprising a set of battery cells, the set of battery cells including M battery cells and where 2≤M≤N and where N>O, where N is a whole number.

7. The battery pack of claim 6, wherein N=5 and O=4.

8. The battery pack of claim 5, wherein the first battery reference node is a battery positive voltage node.

9. The battery pack of claim 5, wherein the battery measurement node is a node between battery cells.

10. A battery pack and battery charger platform, comprising:
   a set of battery packs, the set of battery packs including L elements, each battery pack of the set of battery packs including a different number M of battery cells, where 2≤M≤N and where L≥2 and N>L, where N is a whole number;
   each battery pack of the set of battery packs including a set of battery terminals, the set of battery terminals including O battery terminals, where O<N;
   each set of battery terminals including a first subset of battery terminals, wherein each first subset of battery has a different number of P battery terminals, where 0≤P<O, and each battery terminal of the first subset of battery terminals is coupled to a first battery reference node; and
   each set of battery terminals including a second subset of battery terminals, each second subset of battery terminals including Q battery terminals, where Q=O−P, and each battery terminal of the second subset of battery terminals is coupled to a battery measurement node; and
   a battery charger including a set of charger terminals, the set of charger terminals including O charger terminals, the battery charger configured to mechanically couple to each battery pack in the set of battery packs such that each charger terminal mechanically and electrically couples to a corresponding battery terminal, wherein the battery charger is configured to determine the number of battery cells in the battery pack coupled to the battery charger based on P.

* * * * *